US011156912B2

(12) United States Patent
Lin

(10) Patent No.: US 11,156,912 B2
(45) Date of Patent: Oct. 26, 2021

(54) LITHOGRAPHY MASK AND METHOD FOR MANUFACTURING THE SAME

(71) Applicant: TAIWAN SEMICONDUCTOR MANUFACTURING CO., LTD., Hsinchu (TW)

(72) Inventor: Yun-Yue Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 170 days.

(21) Appl. No.: 15/965,146

(22) Filed: Apr. 27, 2018

(65) Prior Publication Data
US 2019/0101818 A1  Apr. 4, 2019

Related U.S. Application Data

(60) Provisional application No. 62/565,700, filed on Sep. 29, 2017.

(51) Int. Cl.
*G03F 1/32* (2012.01)
*G03F 7/20* (2006.01)
*G03F 1/80* (2012.01)
*B82Y 40/00* (2011.01)

(52) U.S. Cl.
CPC .................. *G03F 1/32* (2013.01); *G03F 1/80* (2013.01); *G03F 7/70283* (2013.01); *B82Y 40/00* (2013.01)

(58) Field of Classification Search
CPC ........... G03F 1/32; G03F 1/80; G03F 7/70283
See application file for complete search history.

(56) References Cited

U.S. PATENT DOCUMENTS

2015/0125785 A1\* 5/2015 Inazuki ..................... G03F 1/32
430/5
2018/0059532 A1\* 3/2018 Inazuki ................. C23C 14/505

OTHER PUBLICATIONS

Garetto, Anthony et al., "Impact of New MoSi Mask Compositions on Processing and Repair," Proc. of SPIE, vol. 7823, 782321, 2010, pp. 1-11.
"Photomasks, Phase Shift Masks", Toppan Photomasks Inc., Sep. 29, 2017, pp. 1-3, https://www.photomask.com/products/phase-shift-masks.
Nozawa, Osamu et al., "High-durability phase-shift film with variable transmittance," Proceedings of SPIE 9635, Photomask Technology 2015, 063517 (Oct. 28, 2015), pp. 1-9.

\* cited by examiner

*Primary Examiner* — Daborah Chacko-Davis
(74) *Attorney, Agent, or Firm* — McDermott Will & Emery LLP

(57) ABSTRACT

A method of manufacturing a phase shift mask includes forming a doped silicon nitride layer on a mask substrate and forming an opaque layer on the doped silicon nitride layer. The opaque layer and doped silicon nitride layer are then patterned to expose portions of the mask substrate to form a plurality of mask features comprising the opaque layer disposed on the doped silicon nitride layer. Portions of the opaque layer are then removed from some of the mask features.

20 Claims, 10 Drawing Sheets

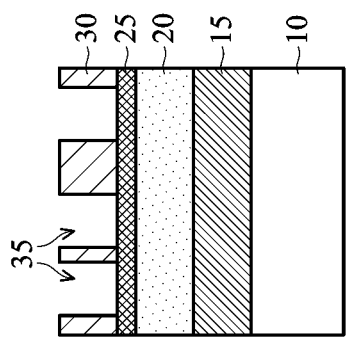
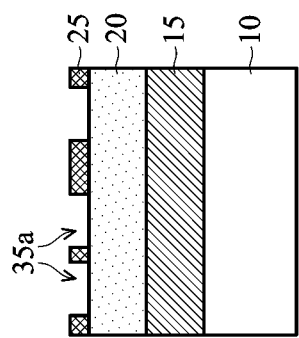
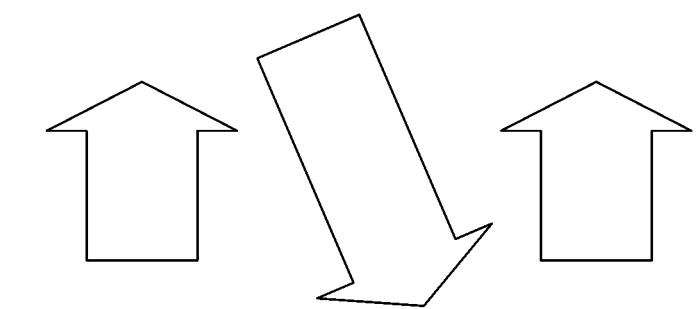
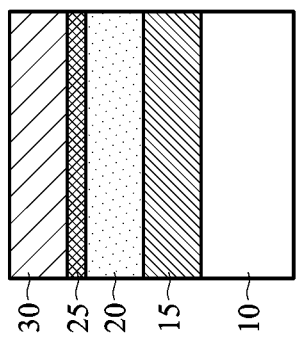
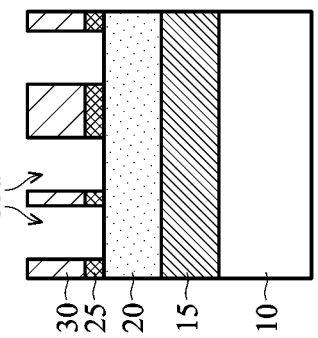
FIG. 4  FIG. 5  FIG. 6  FIG. 7

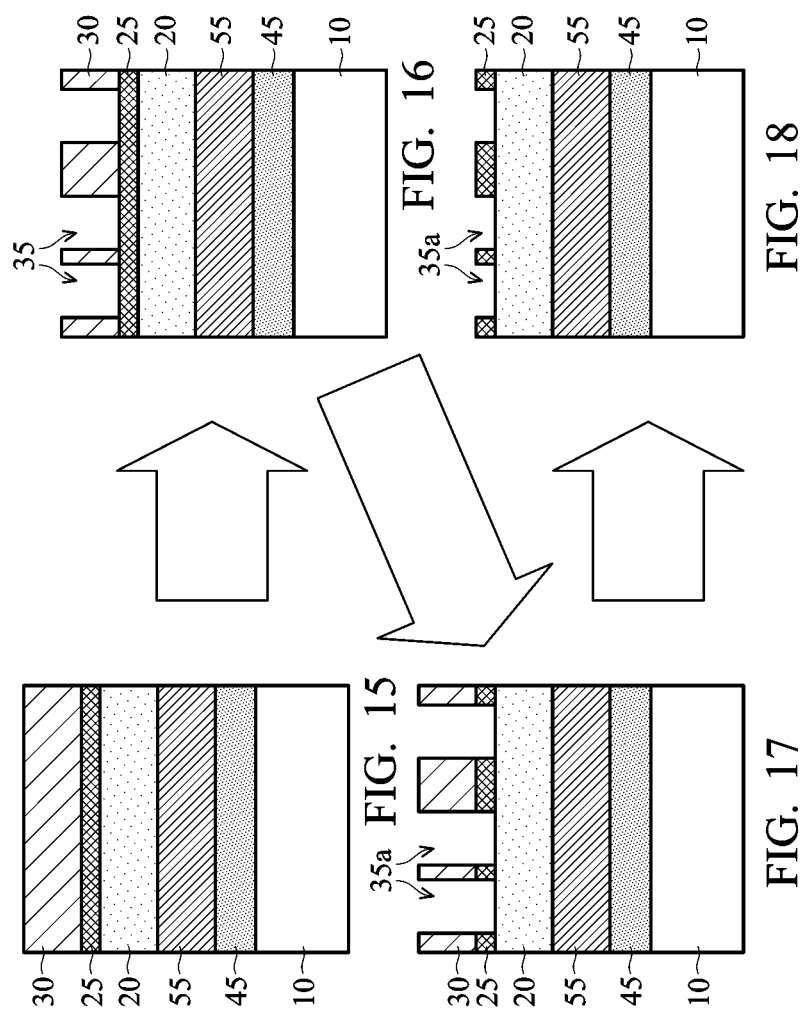

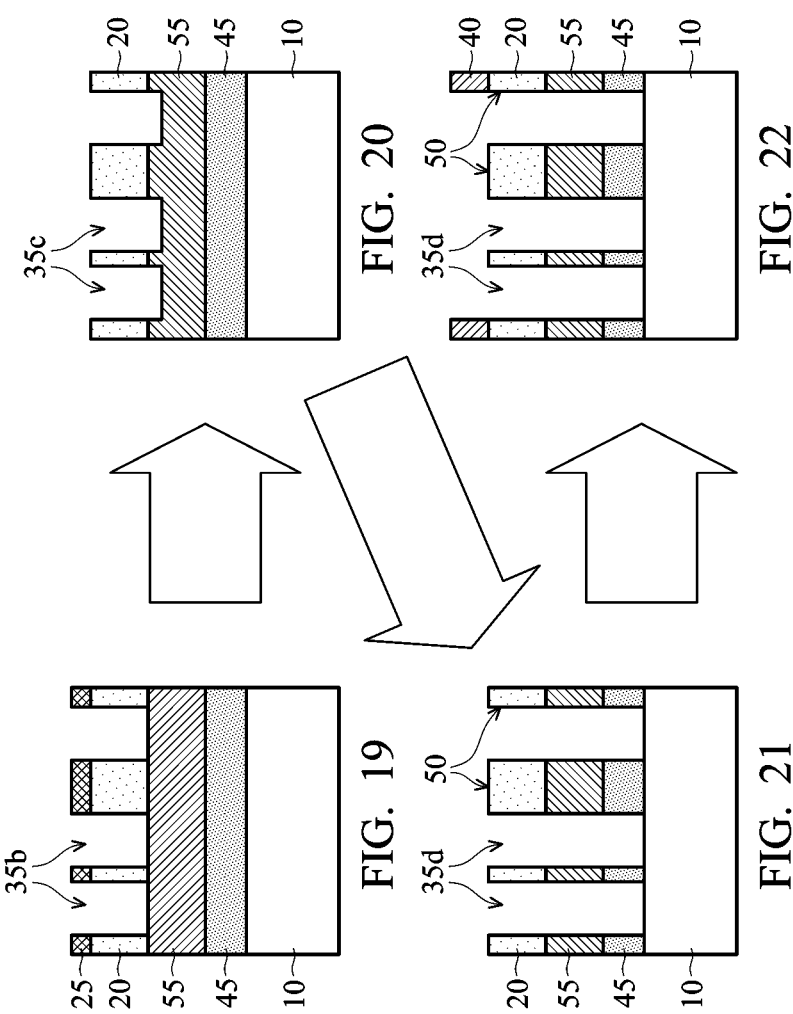

LITHOGRAPHY MASK AND METHOD FOR MANUFACTURING THE SAME

RELATED APPLICATION

This application claims priority to U.S. provisional application No. 62/565,700 filed on Sep. 29, 2017, the entire contents of which are incorporated herein by reference.

TECHNICAL FIELD

The present disclosure relates generally to a phase shift photo mask (reticle) for lithography, and a method for manufacturing the same.

BACKGROUND

A photomask for traditional contact lithography has an opaque material deposited on a portion of a transparent substrate in a particular pattern depending on the desired circuit pattern. The transparent substrate is constructed such that all of the light passing through the substrate emerges with substantial the same phase on the other side (the side of the photomask nearest to or in contact with the photosensitive layer). As feature size on integrated circuits continues to decrease, traditional photomasks which use opaque areas to create a binary intensity profile incident on a photosensitive layer are limited due to light diffracting at the edges of the opaque areas, creating a low-intensity haze around the designed pattern. One of the ways to address these issues is to provide phase shifting regions in the mask to shift the phase of light passing through by 180° and cause destructive interference to reduce the intensity of the diffracted portion of light. The idea is to improve contrast and thereby improve image resolution of the circuit pattern.

Typical phase shift photomasks include an additional layer of material in some portions of the transparent areas such that the light passing through the additional layer is shifted in phase compared to the other portions of the transparent areas. However, selecting an appropriate material for the additional layer (sometimes referred to as the "phase shift material") remains a challenge for several reasons. For example, the material of the additional layer should have fairly high transmittance at the wavelength used for lithography and also be sufficiently hard to withstand the handling of the photomask during the lithography process. Additionally, the phase shift materials also needs to have etch selectivity with respect to the material of the substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4 schematically depicts a cross-section of the photomask of FIG. 1 during a step of manufacturing according to an embodiment of the present disclosure.

FIG. 5 schematically depicts a cross-section of the photomask of FIG. 1 during a step of manufacturing according to an embodiment of the present disclosure.

FIG. 6 schematically depicts a cross-section of the photomask of FIG. 1 during a step of manufacturing according to an embodiment of the present disclosure.

FIG. 7 schematically depicts a cross-section of the photomask of FIG. 1 during a step of manufacturing according to an embodiment of the present disclosure.

FIG. 15 schematically depicts a cross-section of the photomask of FIG. 2 during a step of manufacturing according to an embodiment of the present disclosure.

FIG. 16 schematically depicts a cross-section of the photomask of FIG. 2 during a step of manufacturing according to an embodiment of the present disclosure.

FIG. 17 schematically depicts a cross-section of the photomask of FIG. 2 during a step of manufacturing according to an embodiment of the present disclosure.

FIG. 18 schematically depicts a cross-section of the photomask of FIG. 2 during a step of manufacturing according to an embodiment of the present disclosure.

FIG. 19 schematically depicts a cross-section of the photomask of FIG. 2 during a step of manufacturing according to an embodiment of the present disclosure.

FIG. 20 schematically depicts a cross-section of the photomask of FIG. 2 during a step of manufacturing according to an embodiment of the present disclosure.

FIG. 21 schematically depicts a cross-section of the photomask of FIG. 2 during a step of manufacturing according to an embodiment of the present disclosure.

FIG. 22 schematically depicts a cross-section of the photomask of FIG. 2 during a step of manufacturing according to an embodiment of the present disclosure.

DETAILED DESCRIPTION

Figure 1:
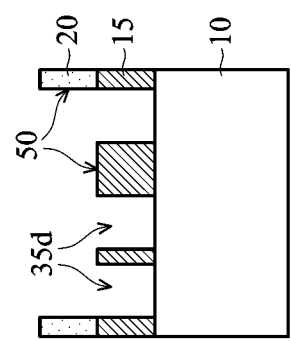
FIG. 1 schematically depicts a cross-section of a photomask according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to photomasks used in lithography, and methods for manufacturing the photomasks. More particularly, it is related to materials used for making phase shift photomasks and methods of manufacturing the phase shift photomasks using such materials. A typical photomask uses a substrate material with high UV transmittance and hardness such as quartz. Silicon nitride is a generally used as phase shift material because of its high transmittance, hardness and high laser durability. However, a typical fluorine dry etching process used for etching silicon nitride during the mask making process also results in etching of some portion of the quartz substrate that is exposed through the phase shift material because of the low etch selectivity between quartz and silicon nitride. Thus results in damage to the quartz substrate when the silicon nitride layer is being etched for patterning.

Another phase shift material generally used in attenuated phase shift masks is molybdenum-silicon (MoSi). MoSi has a significantly lower transmittance than silicon nitride (hence, attenuated). However, because diffracted light typically has a lower intensity than the normally transmitted light, a phase shift material that reduced the intensity of the phase shifted light to the typical intensity of diffracted light is thought to be more efficient at enhancing contrast and reducing the haze around the pattern. However, as is the case with silicon nitride, MoSi also has a low etch selectivity with respect to quartz, and thus suffers similar issues with processing during mask manufacturing.

An alternative phase shift material with high transmittance, high laser durability, and high etching selectivity relative to quartz is, therefore, desired.

Figure 2:
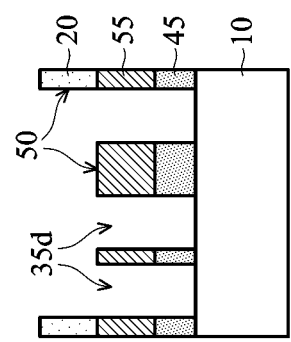
FIG. 2 schematically depicts a cross-section of a photomask according to an alternative embodiment of the present disclosure.

Phase shift photomasks according to embodiments of the present disclosure are shown in FIGS. 1 and 2. Phase shift photomasks according to some embodiments of the present disclosure, as shown in FIG. 1, include a mask substrate 10, first patterned layer 15 (also referred to herein as the phase shifter) comprising a plurality of mask features 50 disposed on the mask substrate 10, and an opaque layer 20 disposed on some of the mask features 50.

In an embodiment, the mask substrate 10 is a quartz plate with low surface roughness. For example, in some embodiments, the quartz plate used for mask substrate 10 is atomically flat to ensure that all the light passing through the quartz plate emerges at substantially the same phase. In some embodiments, the root mean square (RMS) value of the surface roughness of the mask substrate is in the range from about 0.2 nm to about 20 nm. For example, the RMS value of surface roughness of the quartz plate in some embodiments is about 0.2 nm, about 0.5 nm, about 1 nm, about 3 nm, about 5 nm, about 8 nm, about 10 nm, about 13 nm, about 15 nm, about 17.5 nm, about 19 nm, about 20 nm, or any other value between any of these RMS values. The size of the mask substrate is not limited for the purposes of this disclosure, but is chosen based on the size of wafer that will be processed using the photomask. For example, a photomask may be used for wafers with a diameter of 4 inches, 6 inches, 8 inches or 9 inches. Thus, in various embodiments, the photomask has a size suitable for processing the appropriate sized wafer.

The opaque layer 20, in some embodiments, is a metal such as chromium which has high reflectivity for UV wavelengths. In other embodiments the opaque layer 20 is a semi-opaque material such as molybdenum-silicon (MoSi). Typically, the opaque layer 20 is deposited on the side of the mask substrate 10 that will eventually be closest to (or in contact with) the photosensitive layer on the wafer to be patterned. This reduces the travel path of the light after passing through the mask, thereby reducing the lateral exposure of the photosensitive layer on the wafer because of light diffracted from the edges of the pattern of the opaque layer 20.

The thickness of the opaque layer 20 is in the range from about 5 nm to about 100 nm in various embodiments. In some embodiments, the thickness of the opaque layer 20 is about 5 nm, about 10 nm, about 15 nm, about 20 nm, about 30 nm, about 40 nm, about 50 nm, about 65 nm, about 80 nm, about 90 nm, about 100 nm or any other thickness between any of these thickness values. Thinner layers result in some transmission of light, while reducing the diffractive effects. On the other hand, thicker layers result in lesser (or no) transmission of light, but risk increasing the diffractive effects by increasing the distance traveled by the diffracted light, since the diffracted light is not normal to the mask. In other words, the thickness of the opaque layer 20 can be adjusted based on the factors such as the photoresist being used (depending on the sensitivity of the photoresist), and the presence and ability of a phase shift layer 15 to attenuate the light diffracted around the edges of the opaque layer 20.

In some embodiments, the first patterned layer 15 includes a doped silicon nitride layer. The doped silicon nitride layer, in certain embodiments, is doped with oxygen or carbon. In embodiments where silicon nitride for the first patterned layer 15 is doped with carbon, the doping level ranges from about 5 atom % to about 15 atom % of carbon with respect to silicon atoms. For example, the doping level, in some embodiments, is about 5 atom %, about 7.5 atom %, about 9 atom %, about 10.5 atom %, about 12 atom %, about 13.5 atom %, about 15 atom %, or any other level between these levels. Increasing the amount of carbon in carbon-doped silicon nitride decreases the transmittance of silicon nitride and increases the etch selectivity with respect to quartz for a dry etching process such as, for example, a fluorine based dry etching. Thus, the amount of carbon used for doping is dependent on the desired transmittance of the first patterned layer 15, in particular, if the first patterned layer 15 is designed to provide an attenuated phase shift.

In embodiments where the silicon nitride is doped with oxygen, the doping level ranges from about 10 atom % to about 20 atom % of oxygen with respect to nitrogen atoms. For example, the doping level, in some embodiments, is about 10 atom %, about 11.5 atom %, about 13 atom %, about 14.5 atom %, about 16 atom %, about 17.5 atom %, about 19 atom %, about 20 atom %, or any other level between these levels. Increasing the amount of oxygen in oxygen-doped silicon nitride increases the transmittance of silicon nitride and decreases the etch-selectivity with respect to quartz. Thus, the amount of oxygen used for doping depends of the desired transmittance of the first patterned layer 15.

The amount and type of dopant used in the silicon nitride layer determine the refractive index of the first patterned layer 15. The thickness of the doped silicon nitride layer 15 is selected to provide a 180° phase shift to the light transmitted through layer. Thus, depending on the wavelength of light used for lithography, the type of dopant and the amount of dopant, the thickness of the first patterned layer 15 ranges from about 5 nm to about 100 nm in various embodiments. In some embodiments, the thickness of the first patterned layer is about 5 nm, about 10 nm, about 15 nm, about 20 nm, about 30 nm, about 40 nm, about 50 nm, about 65 nm, about 80 nm, about 90 nm, about 100 nm or any other thickness between any of these thickness values.

The first patterned layer 15 is patterned to expose parts of substrate 10. The opaque layer 20 is patterned to expose parts of the first patterned layer 15. The patterns for the first patterned layer 15 and the opaque layer 20 are carefully designed such that the light ultimately reaching the photosensitive layer to be exposed receives the desired pattern following the destructive interference of diffracted light by the phase-shifted light. The desired pattern, thus, has higher resolution, lower "haze" and higher depth of focus when the first patterned layer 15 of appropriate thickness is used.

Phase shift photomasks according to some embodiments of the present disclosure, as shown in FIG. 2, include a mask substrate 10, a first patterned layer 45 disposed on the mask substrate 10, a second patterned layer 55 (also referred to herein as the phase shifter) comprising a plurality of mask features 50 disposed on the first patterned layer 45, and an opaque layer 20 disposed on some of the mask features 50. In various embodiments, the plurality of mask features 50 is formed in the first patterned layer 45 and the second patterned layer 55. In some embodiments, first patterned layer 45 includes a silicon carbonitride or oxygen rich silicon oxynitride layer, and the second patterned layer 55 includes a silicon carbonitride or silicon oxynitride layer. The first patterned layer 45 is between the mask substrate 10 and the second patterned layer 55.

In an embodiment, the mask substrate 10 is a quartz plate with low surface roughness. For example, in some embodiments, the quartz plate used for mask substrate 10 is atomically flat to ensure that all the light passing through the quartz plate emerges at substantially the same phase. In some embodiments, the root mean square (RMS) value of the surface roughness of the mask substrate is in the range from about 0.2 nm to about 20 nm. For example, the RMS value of surface roughness of the quartz plate in some embodiments is about 0.2 nm, about 0.5 nm, about 1 nm, about 3 nm, about 5 nm, about 8 nm, about 10 nm, about 13 nm, about 15 nm, about 17.5 nm, about 19 nm, about 20 nm, or any other value between any of these RMS values.

The opaque layer 20, in some embodiments, is a metal such as chromium which has high reflectivity and high absorption for DUV wavelengths. In other embodiments the opaque layer 20 is a semi-opaque material such as molybdenum-silicon (MoSi). Typically, the opaque layer 20 is deposited on the side of the mask substrate 10 that will eventually be closest to (or in contact with) the photosensitive layer on the wafer to be patterned. This reduces the travel path of the light after passing through the mask, thereby reducing the lateral exposure of the photosensitive layer on the wafer because of light diffracted from the edges of the pattern of the opaque layer 20.

The thickness of the opaque layer 20 is in the range from about 5 nm to about 100 nm in various embodiments. In some embodiments, the thickness of the opaque layer 20 is about 5 nm, about 10 nm, about 15 nm, about 20 nm, about 30 nm, about 40 nm, about 50 nm, about 65 nm, about 80 nm, about 90 nm, about 100 nm or any other thickness between any of these thickness values. Thinner layers result in some transmission of light, while reducing the diffractive effects. On the other hand, thicker layers result in lesser (or no) transmission of light, but risk increasing the diffractive effects by increasing the distance traveled by diffracted light, since the diffracted light is not normal to the mask. In other words, the thickness of the opaque layer 20 can be adjusted based on the factors such as the photoresist being used (depending on the sensitivity of the photoresist), and the presence and ability of a phase shift layer 15 to attenuate the light diffracted around the edges of the opaque layer 20.

In some embodiments, the second patterned layer 55 includes a doped silicon nitride layer. The doped silicon nitride layer, in certain embodiments, is doped with oxygen or carbon. In embodiments where silicon nitride for the second patterned layer 55 is doped with carbon, the doping level ranges from about 5 atom % to about 20 atom % of carbon with respect to silicon atoms. For example, the doping level, in some embodiments, is about 5 atom %, about 7.5 atom %, about 9 atom %, about 10.5 atom %, about 12 atom %, about 13.5 atom %, about 15 atom %, about 17 atom %, about 18 atom %, about 19 atom %, about 20 atom %, or any other level between these levels. Increasing the amount of carbon in carbon-doped silicon nitride decreases the transmittance of silicon nitride and increases the etch selectivity with respect to quartz for a dry etching process such as, for example, a fluorine based dry etching. Thus, the amount of carbon used for doping is dependent on the desired transmittance of the second patterned layer 55, in particular, if the second patterned layer 55 is designed to provide an attenuated phase shift.

In embodiments where the silicon nitride is doped with oxygen, the doping level ranges from about 5 atom % to about 10 atom % of oxygen with respect to nitrogen atoms. For example, the doping level, in some embodiments, is about 5 atom %, about 6 atom %, about 7 atom %, about 8 atom %, about 9 atom %, about 10 atom %, or any other level between these levels. Increasing the amount of oxygen in oxygen-doped silicon nitride increases the transmittance of silicon nitride and decreases the etch-selectivity with respect to quartz. Thus, the amount of oxygen used for doping depends of the desired transmittance of the second patterned layer 55.

The amount and type of dopant used in the silicon nitride layer determine the refractive index of the second patterned layer 55. The thickness of the doped silicon nitride layer 55 is adjusted to provide a 180° phase shift to the light transmitted through layer. Thus, depending on the wavelength of light used for lithography, the type of dopant and the amount of dopant, the thickness of the second patterned layer 55 ranges from about 5 nm to about 100 nm in various embodiments. In some embodiments, the thickness of the first patterned layer is about 5 nm, about 10 nm, about 15 nm, about 20 nm, about 30 nm, about 40 nm, about 50 nm, about 65 nm, about 80 nm, about 90 nm, about 100 nm or any other thickness between any of these thickness values.

In some embodiments, the first patterned layer 45 includes a silicon carbonitride or an oxygen rich silicon oxynitride layer. The silicon carbonitride, in various embodiments, includes carbon in a range from about 5 atom % with respect to silicon to about 30 atom % with respect to silicon. For example, the doping level, in some embodiments, is about 10 atom %, about 11.5 atom %, about 13 atom %, about 14.5 atom %, about 16 atom %, about 17.5 atom %, about 19 atom %, about 20 atom %, about 22 atom %, about 25 atom %, about 27.5 atom %, about 30 atom %, or any other level between these levels. The oxygen rich silicon oxynitride, in some embodiments, includes 10 atom % to about 15 atom % oxygen with respect to silicon. For example, the doping level, in some embodiments, is about 10 atom %, about 11 atom %, about 12 atom %, about 13 atom %, about 14 atom %, about 15 atom %, or any other level between these levels. In other words, the oxygen content in the oxygen rich silicon oxynitride of the first patterned layer 45 is more than the oxygen content of the silicon oxynitride of the second patterned layer 55 (in embodiments that include the silicon oxynitride).

The presence of carbon in the first patterned layer 45 and/or the second patterned layer 55 suppresses formation of silicon dioxide at the surface of the respective layers, thereby improving etch selectivity with respect to quartz by avoiding the need to use a fluorine-based dry etching process for etching the first (and/or second) patterned layer 45.

In various embodiments, the ratio of thickness of the second patterned layer 55 to the thickness of the first patterned layer 45 ranges from about 2:1 to about 10:1, with the first patterned layer 45 being the thinner layer. For example, in some embodiments, the ration of thicknesses is about 2:1, about 2.5:1, about 3.5:1, about 4:1, about 5:1, about 6:1, about 7:1, about 8:1, about 9:1, about 10:1, or any ratio between these ratios. In some embodiments, the thickness of the first patterned layer 45 is in the range from about 1 nm to about 10 nm and the thickness of the second patterned layer 15 has a thickness in the range of about 10 nm to about 100 nm. For example, in an embodiment, the thickness of the first patterned layer 45 is about 1 nm, about 5 nm, about 10 nm, about 15 nm, about 20 nm, about 30 nm, about 40 nm, about 50 nm, about 65 nm, about 80 nm, about 90 nm, about 100 nm. In an embodiment, the thickness of the second patterned layer 55 is about 10 nm, about 15 nm, about 20 nm, about 30 nm, about 40 nm, about 50 nm, about 65 nm, about 80 nm, about 90 nm, about 100 nm.

As discussed elsewhere herein, the thickness of the first and/or second patterned layers depends on several factors including the thickness of other layers, the dopant type used in either of the patterned and the dopant amount in either of the patterned layers.

Figure 3:
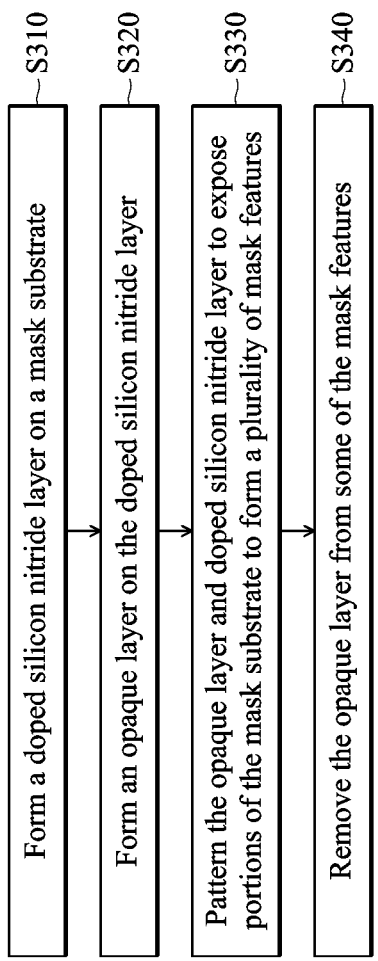
FIG. 3 shows a flow chart for a method of manufacturing the photomask depicted in FIG. 1 according to an embodiment of the present disclosure.

A method of manufacturing a phase shift photomask according to an embodiment of the present disclosure is illustrated in the flow chart shown in FIG. 3, and using the cross-section views of the photomask during various stages of manufacturing depicted in FIGS. 4-13. In an embodiment, the method includes, at S310, forming a doped silicon layer on a mask substrate. The mask substrate is a plate having a low surface roughness and made of a material with high transmittance at relevant wavelengths as well as high roughness. For example, in an embodiment, the mask substrate is a quartz plate with low surface roughness. In some embodiments, the quartz plate used for mask substrate 10 is atomically flat to ensure that all the light passing through the quartz plate emerges at substantially the same phase. In some embodiments, the root mean square (RMS) value of the surface roughness of the mask substrate is in the range from about 0.2 nm to about 20 nm. For example, the RMS value of surface roughness of the quartz plate in some embodiments is about 0.2 nm, about 0.5 nm, about 1 nm, about 3 nm, about 5 nm, about 8 nm, about 10 nm, about 13 nm, about 15 nm, about 17.5 nm, about 19 nm, about 20 nm, or any other value between any of these RMS values.

As shown in FIG. 4, a doped silicon nitride layer 15 is formed on a mask substrate 10. In some embodiments with oxygen as dopant, doped silicon nitride layer 15, is formed by a physical vapor deposition (PVD) process such as, for example, sputtering a silicon target in an environment with nitrogen and oxygen. In other embodiments, the doped silicon nitride layer 15 is deposited using an atomic layer deposition (ALD) process or a chemical vapor deposition (CVD) process. In yet other embodiments, the doped silicon nitride layer 15 is deposited using ion beam assisted deposition (IBD) process.

At S320 an opaque layer is formed on the doped silicon nitride layer. As depicted in FIG. 4, the opaque layer 20 is formed on the doped silicon nitride layer 15. In embodiments where the opaque layer 20 is a metal such as chromium, chromium oxide (CrO), chromium nitride (CrN), chromium oxynitride (CrON), etc. The metal is deposited using a suitable deposition process such as sputtering, atomic layer deposition, or physical vapor deposition (heated or electron-beam assisted). In embodiments where the opaque layer is a semi-opaque material such as s MoSi, the MoSi layer is deposited by sputtering silicon with molybdenum, or using other suitable process such as chemical vapor deposition (CVD), atomic layer deposition (ALD), etc. In some embodiments, the opaque layer 20 is deposited using electroplating, or other suitable deposition techniques.

At S330, the opaque layer and the doped silicon nitride layers are patterned to expose the mask substrate to form a plurality of mask features comprising the opaque layer disposed on the doped silicon nitride layer. The process of patterning the opaque layer and the doped silicon nitride layer is explained in detail with reference to FIGS. 4-10. As depicted in FIG. 4, in some embodiments, in order to generate a desired pattern in the opaque layer 20 and/or the doped silicon nitride layer 15, a hard mask layer 25 is formed on the opaque layer 20. The hard mask layer 25, in some embodiments, is a silicon dioxide layer. In other embodiments, the hard mask layer 25 is a silicon nitride or a suitable metal. In yet other embodiments, the hard mask layer 25 is a titanium nitride layer. The hard mask layer 25, depending on the choice of material, is deposited using a suitable process such as, for example, CVD, PVD, ALD, electroplating, etc. in various embodiments. In certain embodiments, the hard mask layer 25 has a thickness in the range from about 1 nm to about 500 nm, depending on the choice of material for the hard mask layer. For example, in an embodiment, the hard mask layer has a thickness of about 1 nm, about 3 nm, about 5 nm, about 8 nm, about 10 nm, about 20 nm, about 50 nm, about 75 nm, about 100 nm, about 150 nm, about 200 nm, about 250 nm, about 300 nm, about 375 nm, about 450 nm, about 500 nm, or any other value between any of these thickness values.

In some embodiments, as depicted in FIG. 4, a first photoresist layer 30 is formed on the hard mask layer 25. As with any lithography process, the first photoresist layer 30 is a positive photoresist in some embodiments, while a negative photoresist in other embodiments. In some embodiments, depending on the feature sizes, the first photoresist layer 30 is an electron-beam resist which is be patterned using a direct-write process using a focused electron beam.

Because photomasks generally require high fidelity and are used multiple times, the additional time required in patterning using electron beam direct-write process is acceptable. Thus, photolithography-based patterning processes disclosed herein can be replaced by electron beam direct-write processes or other types of electron beam (or ion beam) lithography processes. For simplicity of discussion, the present disclosure uses the term "photolithography" in the context of patterning various layers of the photomask. It will be understood that the term "photolithography" here includes electron beam direct-write processes or other types of electron beam (or ion beam) lithography processes depending on the feature size.

Next, as shown in FIG. 5, the first photoresist layer 30 is patterned using photolithography techniques, including exposing the photoresist to actinic radiation and developing the exposed photoresist, to form photoresist pattern 35 exposing a surface of the hard mask layer 25. Subsequently, the photoresist pattern 35 is extended into the hard mask layer 25 to form hard mask layer pattern 35a, as shown in FIG. 6. The hard mask layer pattern 35a is formed by using suitable etching techniques. Suitable etching techniques, in various embodiments, include wet or dry etching operations. The choice of the etching technique depends on the material of hard mask layer 25 chosen as well as the availability of high-fidelity etching possibilities depending on pattern sizes. For example, if the hard mask layer 25 is a silicon dioxide layer, HF-based wet etching is used in some embodiments.

After etching the hard mask layer, as shown in FIG. 7, the first photoresist layer is removed by a suitable photoresist stripping technique such as, for example, plasma ashing.

Figure 8:
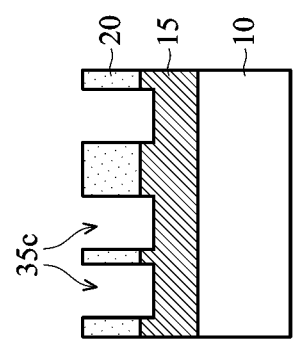
FIG. 8 schematically depicts a cross-section of the photomask of FIG. 1 during a step of manufacturing according to an embodiment of the present disclosure.

Using suitable etching techniques, the hard mask layer pattern 35a is extended into the opaque layer 20, thereby forming opaque layer pattern 35b, as shown in FIG. 8. In various embodiments, the etching techniques for etching the opaque layer 20 are wet or dry or a combination of wet and dry techniques depending on the material of the opaque layer 20. For example, a chlorine/oxygen reactive ion etching process is used for etching chromium, CrO, CrN, CrON, as the opaque layer 20 in some embodiments. Other dry etching techniques include ion milling in some embodiments.

Figure 9:
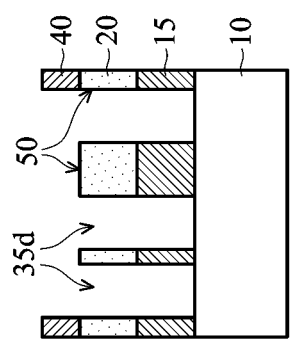
FIG. 9 schematically depicts a cross-section of the photomask of FIG. 1 during a step of manufacturing according to an embodiment of the present disclosure.

The patterned hard mask layer 25 is then removed from the opaque layer 20, as shown in FIG. 9. The same etchant used for etching the hard mask layer 25 during the patterning process can be used for removing the hard mask layer 25. However, because the removal of the hard mask layer 25 happens after a portion of the opaque layer is etched (i.e., when portion of the first patterned layer is exposed), in some embodiments, it is desirable to use different etchant or etching technique to remove the hard mask layer 25 depending on the particular materials. On the other hand, in some embodiments, depending on the etchant and the material of the hard mask layer 25, the hard mask layer removal also removes a portion of the first patterned layer 15, thereby forming a pattern 35c in the first patterned layer 15.

Figure 10:
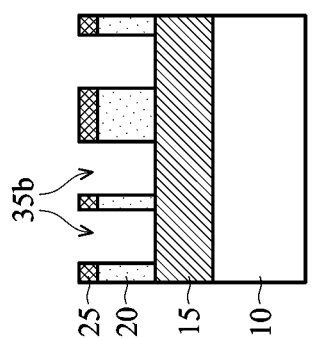
FIG. 10 schematically depicts a cross-section of the photomask of FIG. 1 during a step of manufacturing according to an embodiment of the present disclosure.

The etching of first patterned layer 15 is continued in FIG. 10, to form a mask pattern 35d bounded by mask features 50. The mask features 50 include portions of the opaque layer 20 disposed on portions of the first patterned layer 15.

Figure 11:
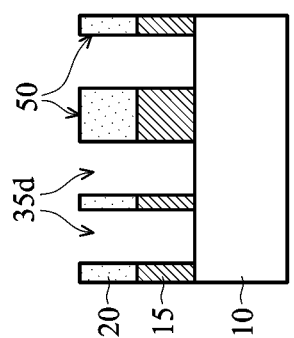
FIG. 11 schematically depicts a cross-section of the photomask of FIG. 1 during a step of manufacturing according to an embodiment of the present disclosure.

Referring again to FIG. 3, at S340, the opaque layer is removed from some of the mask features. Removal of the opaque layer from some of the mask features is described using FIGS. 11-13 as a reference. As depicted in FIG. 11, a second photoresist layer 40 is formed over the photomask. The second photoresist is blanket deposited over the photomask, selectively exposed to actinic radiation, and developed to form a patterned second photoresist layer 40 covering some of the mask features 50 and not formed on (i.e., exposing) other mask features 50. Thus, after the second photoresist layer 40 is patterned, portions of the opaque layer 20 are exposed, while other portions of opaque layer 20 remains covered by the second photoresist layer 40. The determination of which portions of the opaque layer 20 remain covered by the second photoresist layer 40 depends on the final pattern (including the opaque areas and the phase shift areas) desired on the photomask.

Figure 12:
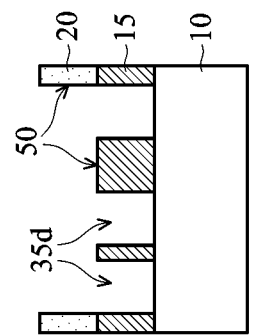
FIG. 12 schematically depicts a cross-section of the photomask of FIG. 1 during a step of manufacturing according to an embodiment of the present disclosure.

The mask features 50 (in the opaque layer 20) not covered with the second photoresist layer 40 are then etched in some embodiments to remove the exposed portion of the opaque layer 20, as shown in FIG. 12. The etchant in this process step (i.e., etching of portions of opaque layer 20) in various embodiments, is a dry etchant or a wet etchant depending on the material of the opaque layer 20. As has been described elsewhere herein, ion milling is used for etching chromium in an embodiment. The second photoresist layer 40 is then removed using, for example, plasma ashing, from the remaining mask features 50 to form the phase shift photomask, as shown in FIG. 13.

Figure 13:
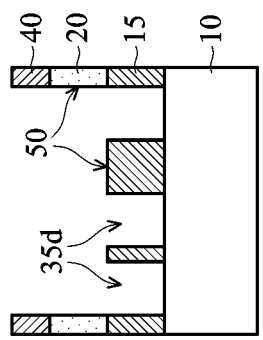
FIG. 13 schematically depicts a cross-section of the photomask of FIG. 1 during a step of manufacturing according to an embodiment of the present disclosure.

In a phase shift photomask such as one depicted in FIG. 13 formed using the method described in FIG. 3, the doped silicon nitride layer forms the phase shift layer. Because the different etchants can be used for etching the doped silicon nitride than are used for etching quartz, the doped silicon nitride can be selectively etched without damaging the underlying surface of quartz 10 that is exposed after patterning the doped silicon nitride layer 15. Thus, the roughness of the quartz substrate can be maintained, resulting in a high quality photomask. In addition, the transmittance of doped silicon nitride can be modulated by changing the doping levels, making it possible to form attenuated phase shift masks which allow only a fraction of incident light to pass through with a phase shift.

Figure 14:
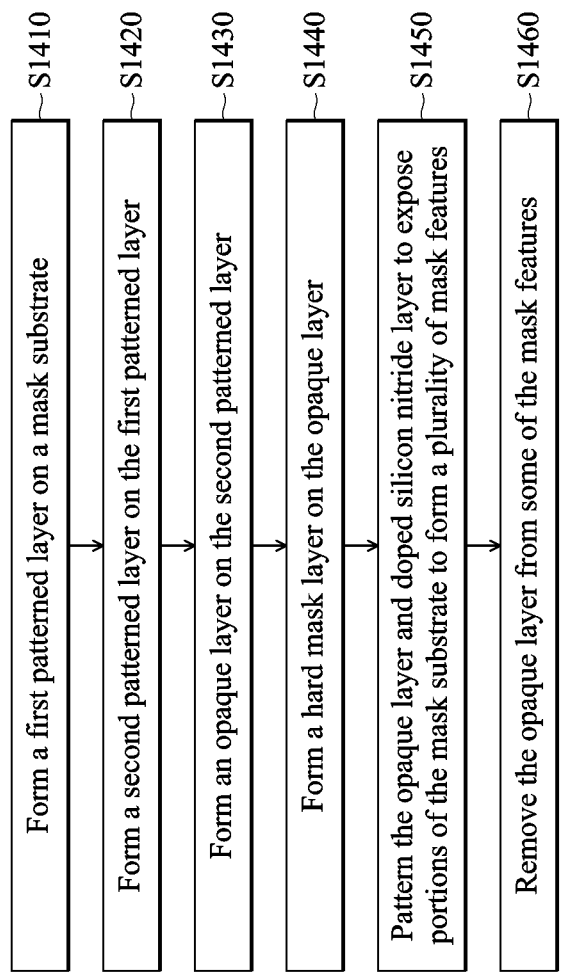
FIG. 14 shows a flow chart for a method of manufacturing the photomask depicted in FIG. 2 according to an embodiment of the present disclosure.

A flow chart for another embodiment of the method of manufacturing a phase shift photomask is shown in FIG. 14, and described in detail with reference to FIGS. 15-24. This embodiment is similar to the embodiment disclosed in FIG. 3, the difference being an additional layer included between the first patterned layer 15 and the substrate 10. For properly distinguishing the two embodiments, the layer 15 of the embodiment of FIGS. 4-13 is relabeled as second patterned layer 55 in FIGS. 15-24 and a first patterned layer 45 is provided between the second patterned layer 55 and the mask substrate 10. Thus, in interest of brevity, the description relating to mask substrate 10, opaque layer 20, the hard mask layer 25, the first photoresist layer 30 and the second photoresist layer 40 will be substantially omitted when describing the embodiment shown in FIGS. 15-24.

In an embodiment, the method includes, at S1410, forming a first patterned layer on a mask substrate. As shown in FIG. 15, a first patterned layer 45 is formed on a mask substrate 10. The first patterned layer 45, in various embodiments, is formed of silicon carbonitride (SiCN) or an oxygen rich silicon oxynitride (SiON). The silicon carbonitride, in various embodiments, includes carbon in a range from about 5 atom % with respect to silicon to about 30 atom % with respect to silicon. For example, the doping level, in some embodiments, is about 10 atom %, about 11.5 atom %, about 13 atom %, about 14.5 atom %, about 16 atom %, about 17.5 atom %, about 19 atom %, about 20 atom %, about 22 atom %, about 25 atom %, about 27.5 atom %, about 30 atom %, or any other level between these levels. The oxygen rich silicon oxynitride, in some embodiments, includes 10 atom % to about 15 atom % oxygen with respect to silicon. For example, the doping level, in some embodiments, is about 10 atom %, about 11 atom %, about 12 atom %, about 13 atom %, about 14 atom %, about 15 atom %, or any other level between these levels. In other words, the oxygen content in the oxygen rich silicon oxynitride of the first patterned layer 45 is more than the oxygen content of the silicon oxynitride of the second patterned layer 55 (in embodiments that include the silicon oxynitride).

In some embodiments, the first patterned layer 45 is formed using a suitable technique such as, for example chemical vapor deposition (CVD) or atomic layer deposition (ALD). In other embodiments, the first patterned layer 45 is formed using a physical vapor deposition technique such as, for example, sputtering a silicon target in an environment with nitrogen and oxygen. The ratio of oxygen and/or carbon can be controlled by varying the deposition parameters such as partial pressure of gases in the deposition chamber.

At S1420, a second patterned layer is formed on the first patterned layer. As shown in FIG. 15, a second patterned layer 55 is formed on the first patterned layer 45. In some embodiments, the second patterned layer is formed of silicon carbonitride (SiCN) or silicon oxynitride (SiON). In some embodiments, the first patterned layer 45 and the second patterned layer 55, are formed of different materials. In other embodiments, the first patterned layer 45 and the second patterned layer 55 are formed of silicon oxynitride with differing oxygen contents, while in yet other embodiments, the first and the second patterned layers 45 and 55 are formed of substantially the same material. The second patterned layer 55 in various embodiments is formed using techniques similar to those used to deposit the first patterned layer 45. For example, in some embodiments, the second patterned layer 55 is formed immediately after the first patterned layer 45 in the same deposition chamber, by changing the gases in the chamber. As discussed elsewhere herein, the thicknesses of the first patterned layer 45 and the second patterned layer 55 are controlled to have a certain ratio as determined based on mask design parameters.

The method continues at S1430, where an opaque layer is formed on the second patterned layer. As depicted in FIG. 15, the opaque layer 20 is formed on the second patterned layer 55. The opaque layer 20 in this embodiment is substantially the same as the opaque layer 20 in the embodiment depicted in reference to FIGS. 4-13. The same discussion is, therefore, applicable for the opaque layer 20 in FIGS. 15-24.

Referring back to FIG. 14, at S1440, a hard mask layer is formed on the opaque layer. For example, as depicted in FIG. 15, the hard mask layer 25 is formed on the opaque layer 20. The hard mask layer 25 in this embodiment is substantially the same as the hard mask layer 25 in the embodiment depicted in reference to FIGS. 4-13. The same discussion is, therefore, applicable for the hard mask layer 25 in FIGS. 15-24.

At S1450, the hard mask layer, the opaque layer, the second patterned layer and the first patterned layer are patterned to expose portions of the mask substrate to form a plurality of mask features comprising the opaque layer disposed on the second patterned layer. The process of patterning the hard mask layer, opaque layer, the second patterned layer and the first patterned layer is explained in detail with reference to FIGS. 15-21. As shown in FIG. 15, a first photoresist layer 30 is formed on the hard mask layer 25. As with any lithography process, the first photoresist layer 30 is a positive photoresist in some embodiments, while a negative photoresist in other embodiments. In some embodiments, depending on the feature sizes, the first photoresist layer 30 is an electron-beam resist which is be patterned using a direct-write process using a focused electron beam.

As shown in FIG. 16, the first photoresist layer 30 is patterned using photolithography techniques to form photoresist pattern 35 exposing a surface of the hard mask layer 25.

Subsequently, the photoresist pattern 35 is extended into the hard mask layer 25 to form hard mask layer pattern 35a, as shown in FIG. 17. The hard mask layer pattern 35a is formed by using suitable etching techniques as discussed elsewhere herein. Suitable etching techniques can include wet or dry etching operations.

After the hard mask layer etching, the first photoresist layer 30 is removed by a suitable photoresist stripping technique, discussed elsewhere herein, as shown in FIG. 18.

Using suitable etching techniques, as discussed elsewhere herein, the hard mask layer pattern 35a is extended into the opaque layer 20, thereby forming opaque layer pattern 35b, as shown in FIG. 19.

The patterned hard mask layer 25 is subsequently removed from the opaque layer 20, as shown in FIG. 20. In some embodiments, the hard mask layer removal also removes a portion of the second patterned layer 55, thereby forming a pattern 35c in the second patterned layer 55. The patterned hard mask layer is removed using suitable etching techniques including, for example, wet and/or dry etching using a fluorine-based etchant depending on the material of the hard mask layer 25.

The etching of the second patterned layer 55 is continued through the first patterned layer 45 in FIG. 21, to form a mask pattern 35d bounded by mask features 50. The mask features 50 include portions of the opaque layer 20 disposed on portions of the second patterned layer 55.

Referring back to FIG. 14, at S1460, the opaque layer is removed from some of the mask features. Removal of the opaque layer from some of the mask features is described using FIGS. 22-24. As depicted in FIG. 22, a second photoresist layer 40 is subsequently formed over the photomask. The second photoresist layer 40 is blanket deposited over the photomask, selectively exposed to actinic radiation, and developed to form a patterned second photoresist layer 40 covering some of the mask features 50 and not formed on other mask features 50, as shown in FIG. 22.

Figure 23:
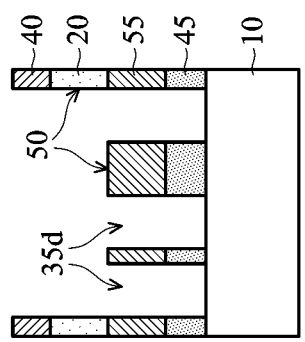
FIG. 23 schematically depicts a cross-section of the photomask of FIG. 2 during a step of manufacturing according to an embodiment of the present disclosure.

The mask features 50 not covered with the second photoresist layer 40 are subsequently etched in some embodiments to remove the opaque layer, as shown in FIG. 23. Then the second photoresist layer 40 is removed from the remaining mask features 50 to form the phase shift photomask, as shown in FIG. 24.

Figure 24:
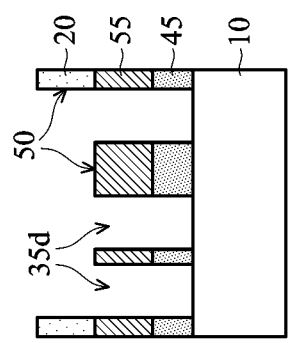
FIG. 24 schematically depicts a cross-section of the photomask of FIG. 2 during a step of manufacturing according to an embodiment of the present disclosure.

In a phase shift photomask such as one depicted in FIG. 24 formed using the method described in FIG. 14, the first patterned layer and the second patterned layer together form the phase shift layer. Because the different etchants can be used for etching the materials of the first and second patterned layers than are used for etching quartz, the first and second patterned layers can be selectively etched without damaging the underlying surface of quartz 10 that is exposed after patterning the first and second patterned layers 45 and 55. Thus, the roughness of the quartz substrate can be maintained, resulting in a high quality photomask. In addition, the transmittance of doped silicon nitride can be modulated by changing the doping levels, making it possible to form attenuated phase shift masks which allow only a fraction of incident light to pass through with a phase shift.

Embodiments of the present disclosure provide phase shift photomasks with high transmission and high laser durability. Embodiments of the present disclosure suppress haze generation. Embodiments according to the present disclosure have improved etch selectivity, and suppressed surface oxide growth.

It will be understood that not all advantages have been necessarily discussed herein, no particular advantage is required for all embodiments or examples, and other embodiments or examples may offer different advantages.

According to one aspect of the present disclosure, a method of manufacturing a phase shift mask includes forming a doped silicon nitride layer on a mask substrate and forming an opaque layer on the doped silicon nitride layer. The opaque layer and doped silicon nitride layer are then patterned to expose portions of the mask substrate to form a plurality of mask features comprising the opaque layer disposed on the doped silicon nitride layer. Portions of the opaque layer are then removed from some of the mask features. In some embodiments, the method further includes forming a hard mask pattern over the opaque layer before patterning the opaque layer and doped silicon nitride layer. In some embodiments, the method includes forming a first photoresist layer over the hard mask layer. In some embodiments, patterning the opaque layer and doped silicon nitride layer includes patterning the first photoresist to form a first photoresist pattern, extending the first photoresist pattern into the hard mask layer to form a hard mask layer pattern, and extending the hard mask layer into the opaque layer and doped silicon nitride layer. In some embodiments, the method further includes removing the first photoresist layer after forming the hard mask layer pattern. In some embodiments, the method further includes forming a second photoresist layer over some of the mask features. In some embodiments, in the removing the opaque layer from some of the mask features, the opaque layer is removed from mask features not having the second photoresist layer formed thereon. In some embodiments, the silicon nitride layer is doped with oxygen or carbon. In some embodiments, the opaque layer includes a metal layer. In some embodiments, the substrate includes quartz.

According to another aspect of the present disclosure, a method of manufacturing a phase shift mask includes forming a first silicon carbonitride or an oxygen rich silicon oxynitride layer on a mask substrate and forming a second silicon carbonitride or silicon oxynitride layer on the first silicon carbonitride or oxygen rich silicon oxynitride layer. An opaque layer is then formed on the second silicon carbonitride or silicon oxynitride layer. A hard mask layer is formed on the opaque layer. The hard mask layer, opaque layer, second silicon carbonitride or silicon oxynitride layer, and first silicon carbonitride or an oxygen rich silicon oxynitride layer are then patterned to expose portions of the mask substrate to form a plurality of mask features including the opaque layer disposed on the second silicon carbonitride or silicon oxynitride layer. The opaque layer is then removed from some of the mask features. In some embodiments, patterning the hard mask layer, opaque layer, second silicon carbonitride or silicon oxynitride layer, and first silicon carbonitride or an oxygen rich silicon oxynitride layer includes forming a first photoresist film on the hard mask layer, patterning the first photoresist to form a first photoresist pattern, extending the first photoresist pattern into the hard mask layer to form a hard mask layer pattern, and extending the hard mask layer pattern into the opaque layer, second silicon carbonitride or silicon oxynitride layer, and first silicon carbonitride or oxygen rich silicon oxynitride layer. In some embodiments, the method further includes forming a second photoresist layer over some of the mask features. In some embodiments, in the removing the opaque layer from some of the mask features, the opaque layer is removed from mask features not having the second photoresist layer formed thereon. In some embodiments, the opaque layer includes a metal layer. In some embodiments, the substrate includes quartz.

According to yet another aspect of the present disclosure, a phase shift photomask includes a first patterned silicon carbonitride or silicon oxynitride layer including a plurality of mask features on a mask substrate, and an opaque layer disposed on some of the mask features. In some embodiments, the phase shift photomask includes a second patterned silicon carbonitride or oxygen rich silicon oxynitride layer between the first patterned silicon carbonitride or silicon oxynitride layer and the mask substrate. In some embodiments, the opaque layer includes chromium or MoSi. In some embodiments, the mask substrate comprises quartz.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a phase shift mask, comprising:
    forming a doped silicon nitride layer on a mask substrate,
    forming an opaque layer on the doped silicon nitride layer;
    forming a hard mask layer over the opaque layer,
    forming a first photoresist layer over the hard mask layer;
    patterning the opaque layer and doped silicon nitride layer to expose portions of the mask substrate to form a plurality of mask features comprising the opaque layer disposed on the doped silicon nitride layer, wherein patterning the opaque layer and doped silicon nitride layer includes:
        patterning the first photoresist layer to form a first photoresist pattern,
        extending the first photoresist pattern into the hard mask layer using a first etchant and thereby forming a hard mask layer pattern,
        removing the first photoresist layer after forming the hard mask layer pattern, and
        extending the hard mask layer pattern into the opaque layer and doped silicon nitride layer;
    removing the opaque layer from some of the mask features; and
    removing the hard mask layer pattern using a second etchant different from the first etchant.

2. The method according to claim 1, further comprising forming a second photoresist layer over some of the mask features.

3. The method according to claim 2, wherein in the removing the opaque layer from some of the mask features, the opaque layer is removed from mask features not having the second photoresist layer formed thereon.

4. The method according to claim 1, wherein the doped silicon nitride layer is doped with oxygen or carbon.

5. The method according to claim 1, wherein the opaque layer is a metal layer.

6. The method according to claim 1, wherein the mask substrate comprises quartz.

7. The method according to claim 1, wherein the doped silicon nitride layer includes oxygen ranging from 10 atom % to 20 atom % with respect to nitrogen.

8. The method according to claim 1, wherein the doped silicon nitride layer includes carbon ranging from 5 atom % to 15 atom % with respect to silicon.

9. The method according to claim 1, further comprising removing the hard mask layer pattern before the removing of the opaque layer.

10. The method according to claim 9, further comprising removing a portion of the doped silicon nitride layer while removing the hard mask layer pattern.

11. A method of manufacturing a phase shift mask, comprising,
forming a first silicon carbonitride or an oxygen rich silicon oxynitride layer on a mask substrate;
forming a second silicon carbonitride or silicon oxynitride layer on the first silicon carbonitride or oxygen rich silicon oxynitride layer;
forming an opaque layer on the second silicon carbonitride or silicon oxynitride layer;
forming a hard mask layer on the opaque layer;
forming a first photoresist film on the hard mask layer;
patterning the first photoresist film to form a first photoresist pattern;
extending the first photoresist pattern into the hard mask layer using a first etchant and thereby forming a hard mask layer pattern;
extending the hard mask layer pattern into the opaque layer, second silicon carbonitride or silicon oxynitride layer, and first silicon carbonitride or oxygen rich silicon oxynitride layer to expose portions of the mask substrate to form a plurality of mask features comprising the opaque layer disposed on the second silicon carbonitride or silicon oxynitride layer;
removing the opaque layer from some of the mask features; and
removing the hard mask layer pattern using a second etchant different from the first etchant.

12. The method according to claim 11, further comprising forming a second photoresist layer over some of the mask features.

13. The method according to claim 12, wherein in there moving the opaque layer from some of the mask features, the opaque layer is removed from mask features not having the second photoresist layer formed thereon.

14. The method according to claim 11, wherein the opaque layer is a metal layer.

15. The method according to claim 11, wherein the mask substrate comprises quartz.

16. The method according to claim 11, further comprising removing the hard mask layer pattern before the removing of the opaque layer.

17. A phase shift photomask, comprising:
a first patterned silicon carbonitride layer comprising a plurality of mask features on a mask substrate;
a second patterned oxygen rich silicon oxynitride layer between the first patterned silicon carbonitride layer and the mask substrate; and
an opaque layer disposed on some of the mask features and in direct contact with the first patterned silicon carbonitride layer, wherein the second patterned oxygen rich silicon oxynitride layer includes 10 atom % to about 15 atom % oxygen with respect to silicon.

18. The phase shift photomask according to claim 17, wherein the opaque layer comprises chromium or MoSi.

19. The phase shift photomask according to claim 17, wherein the mask substrate comprises quartz.

20. The phase shift photomask according to claim 17, wherein a ratio of a thickness of the second patterned oxygen rich silicon oxynitride layer to a thickness of the first patterned silicon carbonitride layer ranges from 2:1 to 10:1.

* * * * *